United States Patent
Silver et al.

(10) Patent No.: US 6,225,936 B1
(45) Date of Patent: May 1, 2001

(54) DIRECT DIGITAL DOWNCONVERTER AND METHOD FOR CONVERTING AN ANALOG SIGNAL TO A DIGITAL SIGNAL

(75) Inventors: Arnold H. Silver, Rancho Palos Verdes; Dale J. Durand, Irvine; Peter L. McAdam, Los Angeles, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/326,073

(22) Filed: Jun. 4, 1999

(51) Int. Cl.$^7$ ...................................................... H03M 1/00
(52) U.S. Cl. ............................................. 341/157; 341/133
(58) Field of Search ..................................... 341/133, 157

(56) References Cited

U.S. PATENT DOCUMENTS

| | | | |
|---|---|---|---|
| 3,678,500 | * 7/1972 | Bauer | 340/347 |
| 4,087,796 | * 5/1978 | Brown | 340/347 |
| 4,635,037 | * 1/1987 | Iwamura | 340/347 |
| 4,646,060 | 2/1987 | Phillips et al. | |
| 5,272,479 | * 12/1993 | Silver | 341/133 |

OTHER PUBLICATIONS

Eaton, et al., "Design of a 10 K NbN A/D Converter for IR Focal Plane Array Sensors", IEEE Transactions on Applied Superconductivity, vol. 5, No. 2, Jun. 1995.

* cited by examiner

Primary Examiner—Michael Tokar
Assistant Examiner—Don Phu Le
(74) Attorney, Agent, or Firm—Michael S. Yatsko

(57) ABSTRACT

A control scheme for operating an oscillator/counter A/D converter so that it simultaneously provides frequency downconversion, band pass filtering and analog-to-digital conversion of an analog signal, where the analog signal includes a carrier wave modulated with information by any known modulation technique. The converter uses a superconducting, Josephson single flux quantum circuit operating as a voltage controlled oscillator. The voltage controlled oscillator receives the analog signal to be converted, and generates a series of sharp, high frequency pulses based on the characteristics of the carrier signal. The series of pulses are applied to a gate circuit that, depending on a gate control signal, either blocks the pulses or passes the pulses to either an increment or a decrement port of a digital counter. When the pulses are passed by the gate circuit, the counter circuit accumulates the pulses during a sampling period. The sampling period covers a range of gate control pulses so that the accumulation of pulses defines consecutive on/off periods of the gate control signal. The scheme provides for frequency conversion and eliminating or minimizing the amount of DC response present in the digital output signal.

22 Claims, 2 Drawing Sheets

DIRECT DIGITAL DOWNCONVERTER AND METHOD FOR CONVERTING AN ANALOG SIGNAL TO A DIGITAL SIGNAL

CROSS-REFERENCE TO RELATED APPLICATIONS

This application is related to the following pending patent applications, which are assigned to the same assignee as the present invention and which are herein incorporated by reference:

1. U.S. patent application Ser. No. 08/920,741, filed Aug. 29, 1997, entitled "Correlated Superconductor Single Flux Analog-to-Digital Converter"; and
2. U.S. patent application Ser. No. 09/127,020, filed Jul. 31, 1998, entitled "Direct Digital Downconverter based on an Oscillator/Counter analog-to-Digital Converter".

BACKGROUND OF THE INVENTION

1. Field of the Invention

This invention relates generally to a system that converts an analog signal to a digital signal having a lower frequency representation and, more particularly, to an oscillator/counter analog-to-digital converter that simultaneously performs frequency downconversion, band pass filtering and an analog-to-digital conversion of an analog signal using a superconducting, Josephson junction single flux quantum circuit to extract information from a modulated carrier wave in a communications, radar, or other system.

2. Discussion of the Related Art

Various communication systems, such as cellular telephone systems, radar systems, etc., transmit information by modulating a high frequency carrier signal with the information to be transmitted. Different modulation techniques are known in the art, such as amplitude modulation, frequency modulation, phase modulation, etc., that impress information onto a carrier signal to be transmitted. The carrier signal is received by a receiver that removes the carrier signal to separate and decipher the transmitted information. To remove the carrier signal, state of the art receivers typically include an analog mixer or a frequency downconverter that multiplies the received carrier signal with a local oscillator signal to remove the carrier signal and convert the signal to a lower intermediate or baseband frequency. The downconverted frequency signal is then filtered by a pass band filter that passes the frequencies of interest that include the extracted information. The filtered signal is then converted to a digital signal by an analog-to-digital (A/D) converter to provide a digital representation of the information that is subsequently processed by a microprocessor. This general description of the process for extracting information from a carrier signal is well known to those skilled in the art.

Although this type of circuit is successful for extracting transmitted information from a carrier signal, improvements can be made. For example, because these types of communication systems first mix the analog carrier signal to provide the downconversion and then filter the downconverted analog signal before the signal is converted to a digital representation, noise from the various amplifiers and other electrical components in the downconverter and filter decreases the signal-to-noise ratio of the signal and thus degrade the receiver performance. Additionally, it takes several discrete electrical circuits to perform the mixing, filtering and analog-to-digital conversion. Therefore, the communication electronics could benefit from decreased complexity, part count, and power consumption of these circuits.

Alternately, frequency downconversion can be performed digitally. A straight-forward method of digitally performing frequency downconversion is to digitize the carrier signal fast enough to record the carrier directly. In principle, the information on the carrier signal can be extracted from the digital data stream using fast Fourier transform (FFT) routines and other digital signal processing techniques. This type of method stresses the performance of the A/D converter and the digital processor, because it needs to sample the signal fast enough to record the carrier while maintaining a very high dynamic range to avoid degrading the signal and the information bandwidth. Because of this requirement, these systems would require an A/D converter and digital signal processor performance which cannot yet be realized in the state of the art.

A second digital technique, presently used to effectively produce frequency downconversion, is known as intermediate frequency (IF) sampling. In IF sampling a narrow band pass analog filter, centered at the carrier frequency, precedes a standard non-integrating A/D converter. The A/D converter is intentionally operated well below the Nyquist condition for the input signal, generating an alias of the signal which effectively converts the frequency of the information. The presence of the narrow band pass filter removes the ambiguity in original signal frequency usually introduced by aliasing in A/D conversion. This technique is fundamentally different from the present invention. IF sampling is based on instantaneous samples of the signal where the sampling is done on a time scale very short compared to one period of the carrier signal. The present invention is based on an integration of the signal over a time longer than a few periods of the carrier signal. This difference leads to significantly different requirements for the analog signal filter and leads to the much greater flexibility of the present invention.

Oscillator/counter A/D converters that use superconducting, Josephson single flux quantum (SFQ) circuits for converting an analog signal to a digital signal are known in the art. See, for example, L. R. Eaton, et al., "Design of a 10 K NbN A/D Converter for IR Focal Plane Array Sensors," IEEE Transactions on Applied Superconductivity, 5,2457, (1995). An improvement to the oscillator/counter A/D converter architecture of the type disclosed in the L. R. Eaton et al. article can be found in the referenced '741 patent application.

A general depiction of an oscillator/counter A/D converter 10 of the type disclosed in the '741 application is shown in FIG. 1. The converter 10 includes a voltage controlled oscillator (VCO) 12, a digital gate circuit 14 and a digital pulse counter circuit 16. Each of the VCO 12, the gate circuit 14 and the counter circuit 16 are general representations of known electrical circuits that perform the functions described herein. The analog carrier signal is received by an antenna (not shown) and is applied to the VCO 12. The VCO 12 converts the analog signal to a series of high frequency SFQ pulses having a pulse frequency proportional to the voltage potential of the analog signal applied to the VCO 12. The VCO 12 uses multiple Josephson Junctions within a direct current superconducting quantum interface device (SQUID) to convert the analog signal to the series of SFQ pulses. The repetition rate of the pulses from the VCO 12 is dependent on the amplitude of the carrier signal and the information modulated thereon. In other words, the VCO 12 will output the pulses at a certain pulse rate depending on the characteristics of the modulated carrier signal. Typically, the pulse rate of the output of the VCO 12 will be much greater than the frequency of the carrier signal.

A control signal is applied to the gate circuit 14 such that when the control signal is high, the gate circuit 14 will pass the pulses from the VCO 12. When the gate circuit 14 passes the pulses from the VCO 12, the counter circuit 16 accumulates and counts the pulses to give a digital representation of the analog input signal to the VCO 12. In one embodiment, the counter circuit 16 is a single flux quantum counter comprising a chain of flip-flops which operate asynchronously to accumulate the total number of pulses from the VCO 12. The total count of the pulses from the VCO 12 during the time that the control signal to the gate circuit 14 is high is the digital representation of the analog signal integrated over the sample time. The state-of-the-art oscillator/counter A/D converter resets the counter circuit 16 to zero before each sample time. In other words, each time the control signal applied to the gate circuit 14 goes low, the counter circuit 16 is reset, so that the sample period is the length of time that one gate pulse is high.

An improved method of operating the converter 10 of FIG. 1 was described in the referenced '020 patent application, and is illustrated in FIG. 2. As previously described, the analog input signal 20 is input into the voltage controlled oscillator 12, where it is converted into a series of sharp, high frequency pulses based on the characteristics of the carrier signal. The series of pulses are applied to a gate circuit 14 that either passes 22 or blocks 24 the pulses depending on a gate control signal. When the pulses are passed by the gate circuit 14, the counter circuit 16 accumulates the pulses during a sampling period T. The sampling period T covers a range of gate control pulses 22, 24 so that the accumulation of pulses defines consecutive on/off periods of the gate control signal. Each time the gate control signal passes the pulses from the voltage controlled oscillator 12, the converter 10 effectively performs a one bit multiplication that gives the frequency conversion. This operating scheme thus provides not only a digital representation of the analog signal, but simultaneously performs frequency downconversion and band pass filtering of the signal.

What would be advantageous, though, would be an operating scheme which would eliminate the DC response.

SUMMARY OF THE INVENTION

In accordance with the teachings of the present invention, a control scheme is provided to operate an oscillator/counter A/D converter so that it simultaneously provides frequency downconversion, band pass filtering and analog-to-digital conversion of an analog signal, where the analog signal includes a carrier wave modulated with information by any known modulation technique. In one embodiment, the converter uses a superconducting, Josephson junction single flux quantum circuit operating as a voltage controlled oscillator (VCO). The VCO receives the analog signal to be converted, and generates a series of sharp, high frequency pulses with a repetition frequency based on the characteristics of the carrier signal. The series of pulses are applied to a gate circuit that connects the pulses alternately to increment and decrement ports of a bidirectional algebraic SFQ pulse counter, with periods between each connection when the transmission of pulses is blocked, in response to signals provided by a gate control signal. The counter circuit accumulates the pulses during a sampling period which covers a range of gate control pulses, so that the accumulation of pulses includes consecutive increment/decrement periods of the gate control signal. Incrementing and decrementing pulses is equivalent to accumulating the product of the SFQ pulse train and one and minus one, respectively.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiments directed to a control scheme for causing an oscillator/counter A/D converter to perform frequency downconversion, is merely exemplary in nature, and is in no way intended to limit the invention or its applications or uses.

Figure 1:
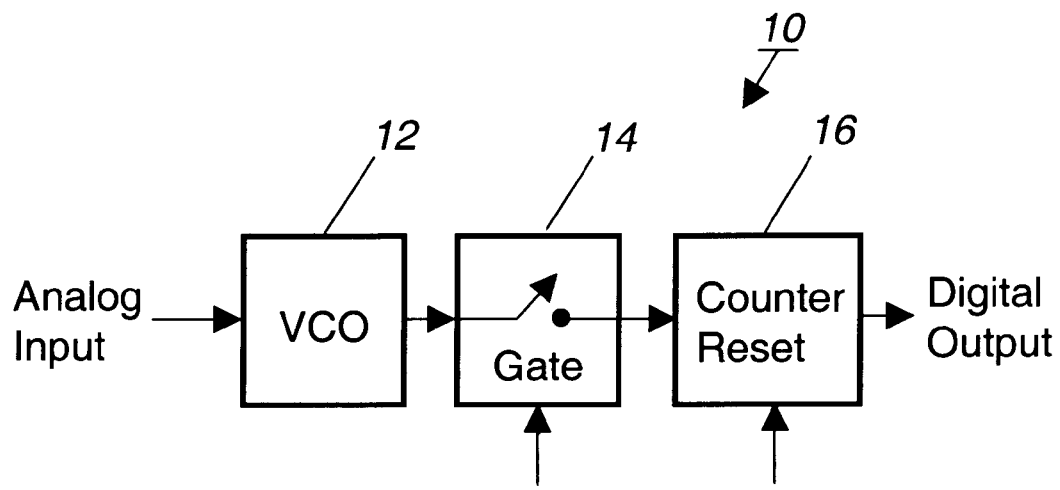
FIG. 1 is a block schematic diagram of an oscillator/counter A/D converter known in the art.
Figure 2:
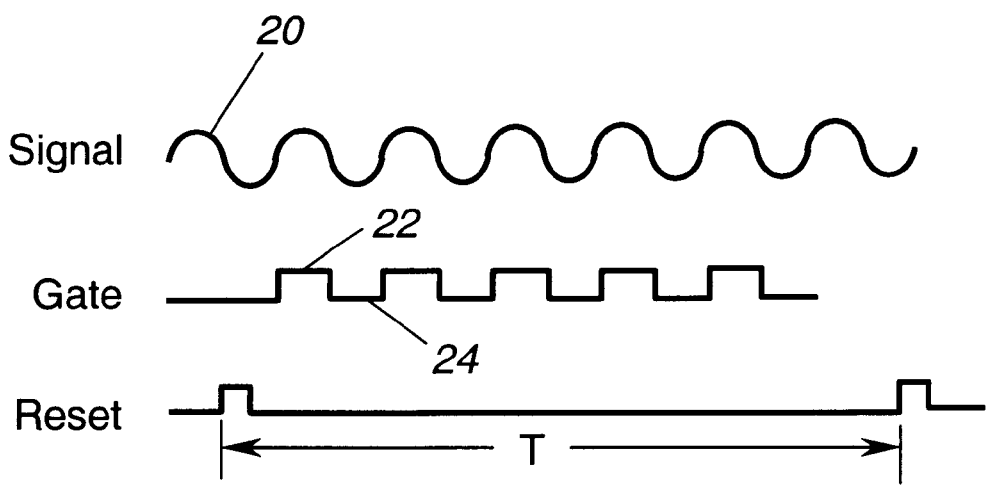
FIG. 2 is a timing diagram for controlling the converter shown in FIG. 1, according to one embodiment of the invention.
Figure 3:
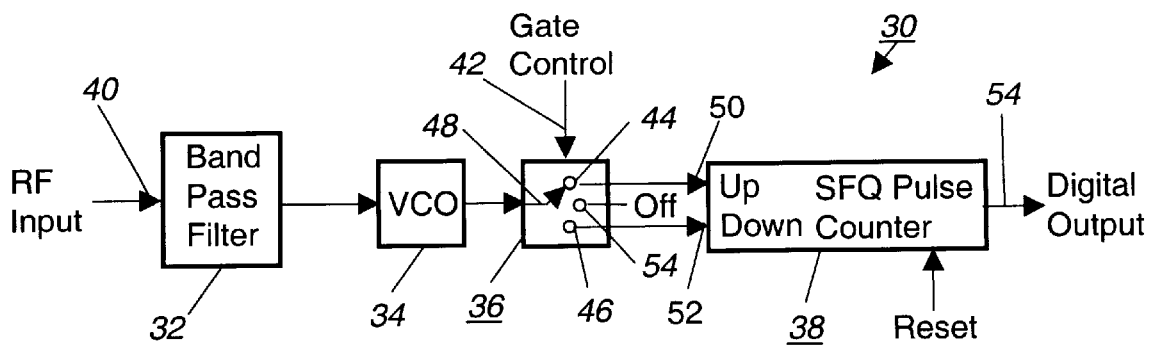
FIG. 3 is a block schematic diagram of an oscillator/counter analog-to-digital converter according to one embodiment of the invention.

Referring now to FIG. 3, the converter 30 is used to provide a digital representation of an analog signal. The converter 30 includes a band pass filter 32 having an input port 40 by which the RF input signal in input into the converter 30, and a voltage controlled oscillator (VCO) 34 connected to the band pass filter 32. If desired, the band pass filter 32 can be eliminated, and the RF signal would enter the converter 30 directly into the VCO 34. The oscillator 34 is connected to a pulse controlled gate 36 which includes a switch 48 operable between two outputs 44, 46, and the null position 54. Although illustrated in FIG. 3 as a mechanical switch 48, the switch 48 can also be an electronic switch which accomplishes the same switching function. The two outputs 44, 46 are in turn connected respectively to increment 50 and decrement 52 input ports of the SFQ pulse counter 38. The pulse counter 38 is an algebraic bidirectional counter such as that found, for example, in U.S. Pat. No. 4,646,060. The pulse counter 38 also includes an output port 54 through which the digital signal exits the converter 30.

In general, the frequency downconversion and band pass filtering functions are provided by extending the accumulation time of the counter circuit 38 to cover a series of control pulses applied to the gate circuit 36. According to the preferred embodiment, the gate circuit 36 is repetitively operated many times in a single sample period before resetting the counter circuit 38. The pulse counter circuit 38 accumulates the total number of pulses over several consecutive open (increment and decrement) and closed periods of the gate circuit 36. This operation produces an A/D converter reading that is equivalent to the reading of a conventional A/D converter following a mixer and filter which is low pass filtered at the downconverted frequency and therefore band pass filtered at the rf frequency.

In operation, the RF signal is passed through an analog filter 32 to provide a coarse or rough limiting of the frequencies being converted, and then is inserted into the VCO 34, where the analog signal is converted to a plurality of high frequency pulses having a pulse frequency proportional to the voltage potential of the RF analog signal.

Figure 4:
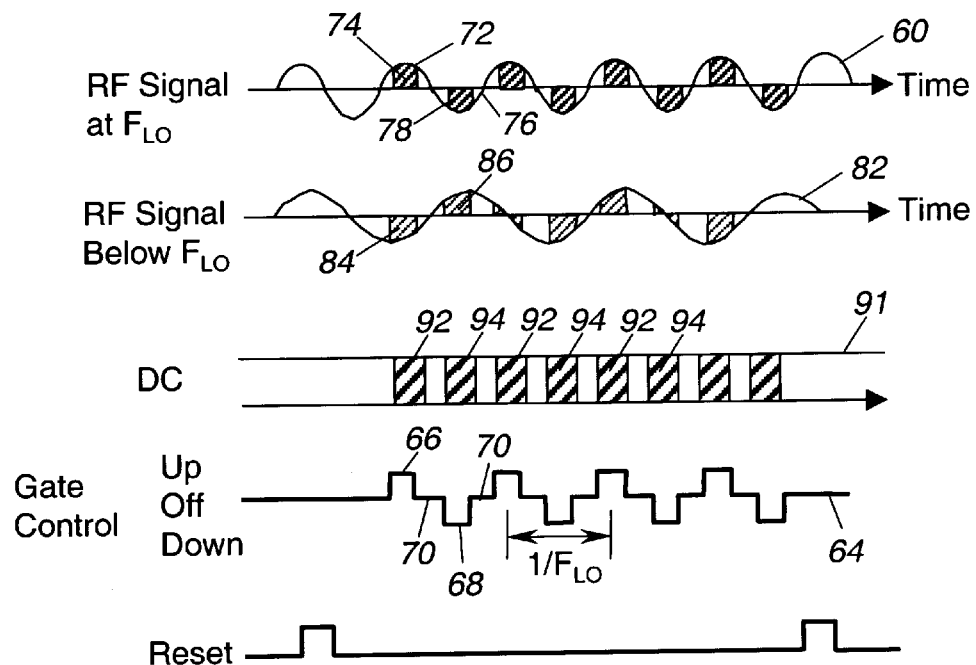
FIG. 4 is a timing diagram for controlling the converter shown in FIG. 3.

FIG. 4 shows an example of the RF signals applied and a timing diagram that controls the operation of the converter 30 as a digital frequency downconverter according to the invention. The signal line 60 represents the analog input carrier wave applied to the VCO 34 at a carrier wave frequency $F_{LO}$ of interest. Although not specifically shown, the carrier wave 60 would be modulated by some known modulation format, such as amplitude modulation or frequency modulation. Also not shown is that the rf signals, 60 and 82, are offset by a constant voltage greater than ½ the peak-to-peak voltage range so that the signal voltage is always greater than zero. The pulses generated at the VCO 34 are always positive and their frequency is always greater than zero. The output of the VCO 34 would be a series of short pulses having a frequency greater than the carrier signal. The gate line 64 is a gate control signal that is typically a series of square wave pulses, where the pulses are high 66 one-quarter of the time, low 68 one-quarter of the time, and neutral 70 one-half of the time. The gate circuit 36, and more particularly the switch arm 48, is connected to the output 44 to pass the SFQ pulses to the increment input 50 of the pulse counter 38 when the control signal is high 66. To demodulate an AM signal, high pulses 66 of the gate signal 64 are aligned with the positive portions 72 of the carrier signal 60, with the result being the addition of the pulses within the area 74 under the positive cycle 72. These pulses are incremented or added within the pulse counter 38.

During the next quarter pulse 70, the gate control signal value is neutral, which causes the switch arm 48 to be connected to the null contact 54. During this period, no pulses are sent to the counter 38.

The next quarter cycle 68 has a low gate control signal. The gate circuit 36, and more particularly the switch arm 48, is connected to the output 46 to pass the SFQ pulses to the decrement input 52 of the pulse counter 38 when the control signal is low 68. To demodulate an AM signal, low pulses 68 of the gate signal 64 are aligned with the negative portions 76 of the carrier signal 60, resulting in the transmission of the pulses within the area 78 under the negative cycle 76 to be decremented in the counter 38. The VCO frequency during the time 74 is greater than the average while the VCO frequency during the time 78 is less than the average. The result of incrementing the counter 38 while the VCO frequency is high, and decrementing the counter 38 while the frequency is low, is to maximize the count. This provides the highest output 54 at the carrier wave frequency, as illustrated by the curve section 90 in FIG. 5.

For the final quarter of the gate signal cycle, the gate control signal is neutral, which connects the switch arm 48 to the null contact 54 and prohibits the transmission of any pulses to the counter 38.

This process is repeated numerous times, with the counter accumulating the pulses, until the counter is reset. The reset line is a periodic reset signal that is applied to the counter circuit 38 to reset it. The reset period satisfies the Nyquist condition of the information bandwidth of the signal applied to the VCO 34. The total count of the accumulation of the SFQ pulses from the VCO 34 during the time that the gate circuit 36 is passing the pulses is the digital representation of the signal applied to the VCO 34, integrated over the sampling period between the reset pulses. The counter circuit 38 acts like a low pass filter, and provides a digital output representation of the analog input signal between the pulses of the reset signal.

Figure 5:
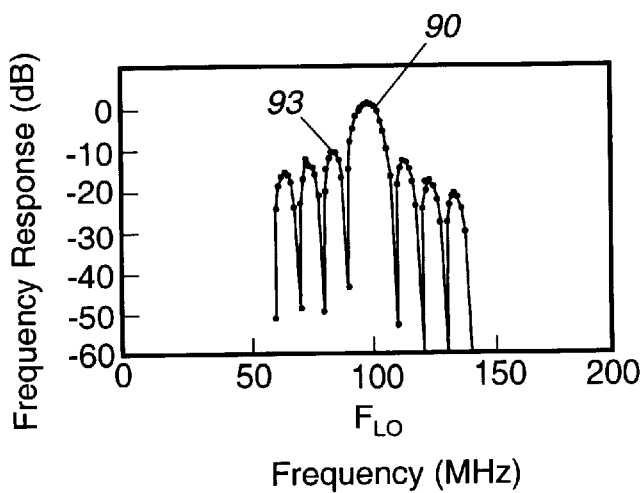
FIG. 5 is a graph illustrating the output signal resulting from the conversion performed by the converter of FIG. 3.

As previously mentioned, the frequency of the gate control signal 64 is the same as the frequency of the carrier wave 60 of interest. FIGS. 4 and 5 also illustrate the case where the gate control signal is not the same as the frequency of the carrier wave, such as might occur with respect to out-of-band signals. In FIG. 4, the carrier wave 82 has a frequency below $F_{LO}$. The areas 84, 86 aligned with the high 66 and low 68 pulses of the gate control signal are not equivalent, as they are in the case when the carrier wave 60 is of the same frequency as the gate control signal. This causes a differing number of pulses being transmitted to the increment and decrement ports 50, 52 of the counter 38, and results in a lesser number of pulses being counted. The output of the counter 38 for the non-aligned frequency signal is shown as the curve portion 93 in FIG. 5.

Also illustrated in FIG. 4 is the signal diagram showing how the DC response has been eliminated by the alternate incrementation/decrementation within the counter 38. A DC signal 91 would have the pulses 92 counted while the gate control pulse 66 is high sent to the increment 50 port of the counter 38, and the pulses 94 counted while the gate control pulse 68 is low sent to the decrement 52 port of the counter 38. These pulses 92, 94 are equal in number and sign, so they would cancel each other out in the counting performed by the counter 38. Hence, the system 30 described has eliminated the DC response as desired.

As is apparent, there are several gate control pulses between the two reset pulses. Many SFQ pulses pass through the gate circuit 36 when the gate signal is high or low. The converter 30 performs the frequency downconversion because the high/neutral/low/neutral cycling of the gate control signal 64 mathematically performs a signed one-bit multiplication of the SFQ pulses representing the analog signal applied to the VCO 34. In other words, the opening and closing of the gate circuit 36 multiplies the SFQ pulses by a digital positive one, negative one, or zero, so that the information is effectively converted to another frequency. The rate and width of the gate control signal 64, and the frequency of the reset signal, would be designed for each particular application by considering the frequency and modulation of the carrier signal 60, and the information to be extracted. By controlling the rate and width of the gate control signal 64, the converter 30 has a high degree of flexibility for converting the analog signal to different frequency representations.

In the limit of low quantization noise, equivalently in the limit of high VCO frequency, the number of pulses counted between reset pulses is the integral of the product of the gate circuit control signal 42 and the input analog signal 40, where the gate control signal 42 is equal to one when it is in the state to pass pulses from the VCO 34 to the increment port of the counter circuit 38, equal to zero when it is in the state to block these pulses, and equal to negative one when it passes pulses to the decrement port of the counter 38. This is equal to the integral, or sum, of the product of the analog signal 32 and the gate signal 42, as shown in FIG. 4. ADC is the digital signal 54 from the converter 38, and is defined as:

$$ADC = \int_{-\infty}^{+\infty} \text{signal} \times \text{gate} \qquad (1)$$

The gate circuit control signal 42 may be constructed from the product of three functions, two continuously periodic square waves and a single window pulse. The product of the two periodic square waves has a fundamental frequency of $F_{LO}$. It has no frequency content at dc. The large single window pulse leads to the frequency response shown in FIG. 5, having a sin(x)/x character, where x is equal to $\pi x\, f \times w$ and the periodic waveforms define the center frequency. There are also sin(x)/x responses centered at frequencies where the periodic waveform has content. In this situation with the timing displayed in FIG. 4, the integrated product of Equation 1 is effectively full-wave digital rectification of the analog signal, whose short-term value has the amplitude modulation signal but does not have any DC component.

The described invention provides an elegant technique for simultaneously performing analog-to-digital conversion, frequency conversion and band pass filtering in a less complex system than is known in the prior art, and at a reduced power consumption. The system eliminates the DC response. The system described herein has an extended use in many types of communication and radar systems, and provides significant improvements over the known systems.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

We claim as our invention:

1. A method of converting an analog input signal to a digital output signal comprising:
   converting the analog input signal to a series of pulses;
   alternately blocking and passing the pulses at a predetermined control rate, with the passing of pulses comprising alternately transmitting the pulses to increment and decrement input ports of an accumulator with a blocking of pulses occurring between each passing;
   accumulating the series of pulses that are passed in a digital counter where the accumulation of pulses defines the digital output signal; and
   applying a reset signal to the digital counter to define a predetermined sampling period that provides an initiation of a new accumulation of the series of oscillator pulses.

2. The method according to claim 1 wherein the step of converting the analog input signal to a series of pulses includes using a voltage controlled oscillator.

3. The method according to claim 2 comprising forming the voltage controlled oscillator from a superconducting quantum interface device including multiple Josephson Junctions.

4. The method according to claim 1 wherein alternately blocking and passing the pulses includes providing a digital gate that receives a gate control signal that is a series of square wave pulses alternating between high, neutral and low states, and passing the series of pulses when the gate control signal pulses are high and low, and blocking the series of pulses when the gate control signal pulses are neutral.

5. The method according to claim 1 comprising sampling the accumulation of pulses over a sampling period covering a plurality of consecutive blocking and passing times for the pulses.

6. The method according to claim 1 wherein converting the analog input signal to a series of pulses includes converting the analog input signal to a series of pulses having a higher frequency than the analog signal.

7. The method according to claim 1 comprising utilizing the series of pulses to generate a frequency proportional to the amplitude of the analog signal.

8. The method according to claim 1 wherein accumulating the series of pulses includes accumulating the series of pulses by a digital counter.

9. The method according to claim 1 comprising utilizing a single flux quantum counter for the digital counter.

10. The method according to claim 1 including band pass filtering the analog signal prior to converting the analog signal into a series of pulses.

11. The method according to claim 1 wherein converting the analog input signal to a series of pulses comprises representing a positive portion of said analog signal by a first series of pulses, representing a negative portion of said analog signal by a second series of pulses, and further comprising passing said first series of pulses to said increment input port of said accumulator and passing said second series of pulses to said decrement input port of said accumulator.

12. A method of converting an analog input signal to a digital output signal where the digital output signal is a frequency conversion representation of the input signal comprising:
   providing an oscillator circuit that receives the analog input signal;
   converting the analog input signal to a series of oscillator pulses that have a frequency proportional to the characteristics of the analog input signal;
   providing a digital gate that receives the series of oscillator pulses;
   applying a gate control signal to the digital gate where the control signal is a series of control pulses that alternately:
      pass the series of oscillator pulses to an increment port of a digital counter;
      block the series of oscillator pulses from being transmitted to the digital counter;
      pass the series of oscillator pulses to a decrement port of the digital counter; and
      block the series of oscillator pulses from being transmitted to the digital counter;
   accumulating the series of oscillator pulses that are passed by the digital gate in the digital counter, wherein the accumulation of pulses defines the digital output signal; and
   applying a reset signal to the digital counter to define a predetermined sampling period that provides an initiation of a new accumulation of the series of oscillator pulses, said sampling period covering a plurality of consecutive control pulses of the control signal.

13. The method according to claim 12 comprising forming the oscillator from a superconducting quantum interface device that includes multiple Josephson junctions.

14. The method according to claim 12 generating a frequency of the series of oscillator pulses greater than the frequency of the analog signal.

15. The method according to claim 12 wherein converting the analog input signal to a series of pulses comprises representing a positive portion of said analog signal by a first series of pulses, representing a negative portion of said analog signal by a second series of pulses, and further comprising passing said first series of pulses to said increment input port of said digital counter and passing said second series of pulses to said decrement input port of said digital counter.

16. The method according to claim 15 comprising utilizing a frequency for the control signal equal to a carrier frequency for said analog input signal.

17. A system for converting an analog input signal to a digital output signal where the digital output signal is a frequency conversion representation of the input signal, said system comprising:

an oscillator circuit responsive to the analog input signal, said oscillator circuit converting the analog input signal to a series of oscillator pulses that have a frequency proportional to the characteristics of the analog input signal;

a digital gate connected to the oscillator circuit which receives the series of oscillator pulses from the oscillator circuit, said digital gate being responsive to a gate control signal to transmit the series of received oscillator pulses to a first digital gate output, a second digital gate output, and a null output; and a digital counter having an increment input port connected to the first gate output and a decrement input port connected to the second gate output, said digital counter accumulating the series of oscillator pulses where the accumulation of pulses define digital output signals, said digital counter being responsive to a reset signal that resets the digital counter to provide an initiation of a new accumulation of the series of oscillator pulses and define a predetermined sample, said sampling period covering a plurality of consecutive control pulses of the gate control signal.

18. The system according to claim 17 wherein the oscillator circuit is a superconducting quantum interface device that includes multiple Josephson Junctions.

19. The system according to claim 18 wherein the digital counter is a single flux quantum counter.

20. The system according to claim 18 wherein said analog signal has a carrier wave frequency, and said gate control signal has a frequency substantially the same as the carrier wave frequency.

21. The system according to claim 20 wherein the analog signal comprises positive signal portions containing first oscillator pulses and negative signal portions containing second oscillator pulses, and wherein said gate control signal is operative to control said digital gate such that said first oscillator pulses are transmitted to said first gate output and said second oscillator pulses are transmitted to said second gate output.

22. The system according to claim 21 wherein said gate control signal includes neutral periods during which said digital gate transmits said oscillator pulses to said null output.

* * * * *